United States Patent
Tanaka et al.

(10) Patent No.: US 6,569,237 B2
(45) Date of Patent: May 27, 2003

(54) METHOD OF PULLING UP SILICON SINGLE CRYSTAL AND METHOD OF MANUFACTURING EPITAXIAL WAFER

(75) Inventors: Tadami Tanaka, Saga (JP); Toshiaki Ono, Saga (JP); Eiichi Asayama, Saga (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 9 days.

(21) Appl. No.: 09/884,994

(22) Filed: Jun. 21, 2001

(65) Prior Publication Data

US 2002/0000189 A1 Jan. 3, 2002

(30) Foreign Application Priority Data

Jun. 26, 2000 (JP) .......................................... 2000-190766

(51) Int. Cl.[7] ........................... C30B 15/20; C30B 15/02
(52) U.S. Cl. ................................ 117/19; 117/13; 117/20
(58) Field of Search ................................. 117/13, 19, 20

(56) References Cited

U.S. PATENT DOCUMENTS 6,139,625 A * 10/2000 Tamasuka et al. ............ 117/19
6,197,109 B1 * 3/2001 Iida et al. ...................... 117/19
6,299,982 B1 * 10/2001 Tamatsuka et al. .......... 428/446

FOREIGN PATENT DOCUMENTS

| JP | 11-189493 | 7/1999 |
| JP | 2000-44389 | 2/2000 |

* cited by examiner

Primary Examiner—Felisa Hiteshew
(74) Attorney, Agent, or Firm—Armstrong, Westerman & Hattori, LLP

(57) ABSTRACT

A method of producing high-quality epitaxial wafers with scarce occurrence of epitaxial layer defects by allowing an epitaxial layer on wafers sliced from a nitrogen-doped silicon single crystal as well as a method of pulling up a silicon single crystal to serve as the raw material therefore is provided. More particularly, a method of pulling up a single crystal from a nitrogen-doped silicon material melt while allowing the single crystal to grow is provided which comprises employing a passing or residence time in the temperature range of 1150–1050° C. of not less than 50 minutes and/or a passing or residence time in the temperature range of 1050–950° C. of not more than 40 minutes in the step of pulling up of the single crystal. Further, a method of manufacturing epitaxial wafers is provided which comprises allowing an epitaxial layer on the surface of silicon wafers sliced from the single crystal pulled up by the method mentioned above.

12 Claims, 7 Drawing Sheets

FIG. 7A  Prior Art                    FIG. 7B
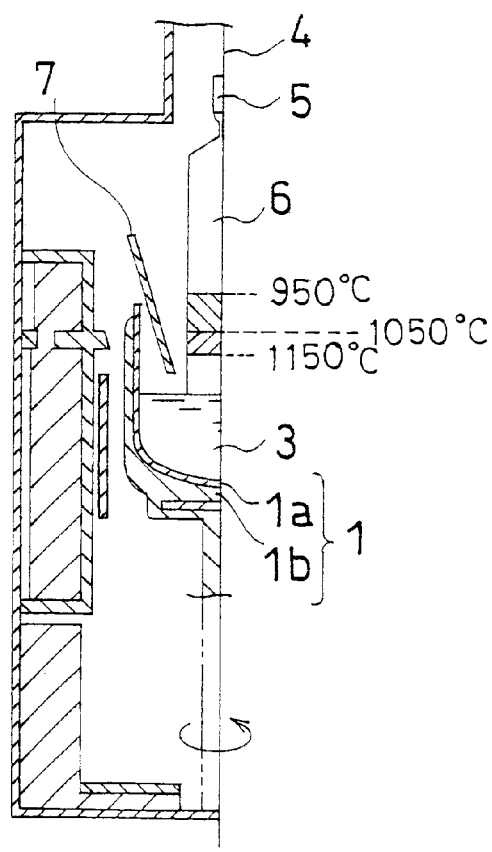
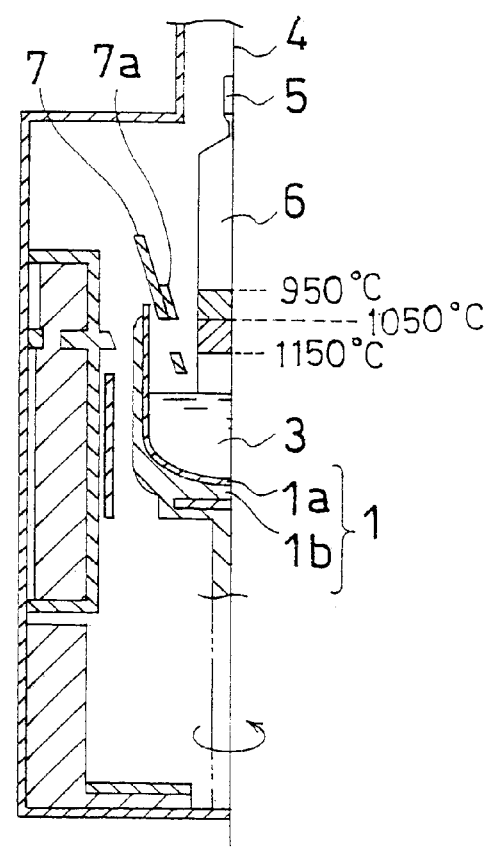

METHOD OF PULLING UP SILICON SINGLE CRYSTAL AND METHOD OF MANUFACTURING EPITAXIAL WAFER

FIELD OF THE INVENTION

The present invention relates to a method of pulling up a nitrogen-doped silicon single crystal, which is intended for use in the manufacture of a semiconductor device, and to a method of manufacturing an epitaxial wafer using a silicon wafer prepared from a silicon single crystal produced by that method. More particularly, it relates to a method of manufacturing a high-quality epitaxial wafer while scarcely giving rise to stacking faults, dislocations and other defects in an epitaxial layer (hereinafter collectively referred to as "epitaxial layer defects") when it is grown on a wafer sliced from a nitrogen-doped silicon single crystal, and to a method of producing such a single crystal to serve as a raw material for the epitaxial wafer.

DESCRIPTION OF THE PRIOR ART

In the art, silicon single crystals for use in manufacturing semiconductor devices are produced by the Czochralski method (CZ method). FIG. 1 is a sectional view schematically illustrating a producing apparatus used in the CZ method. The producing apparatus comprises a crucible 1 disposed in the middle of the apparatus, and the crucible comprises a quartz vessel 1a and a graphite vessel 1b with the quartz vessel closely fitted therein. A heater 2 is disposed in a manner surrounding the crucible 1 and a raw silicon material is contained in a molten form 3 as melted by the heater. Above the crucible 1, there is suspended a pulling shaft 4 with a seed crystal 5 mounted thereon, and the shaft pulls up a single crystal 6 while allowing it to grow from the lower end of the seed crystal 5. A heat shield 7 is disposed in a manner surrounding the growing single crystal 6.

With the recent increase in the integration density of silicon semiconductor devices, quality requirements imposed on silicon wafers on which devices are formed have become more and more severe. For example, severer limitations are imposed than ever on dislocations and like crystal defects and/or metal impurities in the so-called "device active region" where devices are formed, with the increasing fineness of circuits as resulting from the increase in integration density, since such defects and impurities increase the leakage current and shorten the life of a carrier.

Wafers sliced from silicon single crystals produced by the CZ method generally contain about $10^{18}$ atoms/cm$^3$ of supersaturation oxygen. Due to the thermal history in the steps of device formation, such oxygen forms oxide precipitate nuclei and thereby induces crystal defects such as dislocations and stacking faults. In the process of device manufacture, however, the so-called DZ layer (denuded zone) which is free of crystal defects and has a thickness of about tens of micrometers is formed near the wafer surface by diffusion of oxygen to the outside when the wafer is maintained at about 1100° C. for several hours in the step of field oxide film formation by LOCOS (local oxidation of silicon) or well diffusion layer formation. The DZ layer serves as a device active region, so that the occurrence of crystal defects is spontaneously prevented.

However, with the increase in the integration density of semiconductor devices, the high-energy ion implantation technique has been introduced for well formation by which the device process is carried out at a low temperature of 1000° C. or less. At such a temperature, the above-mentioned outward diffusion of oxygen does not occur to a sufficient extent, hence the DZ layer formation near the surface becomes insufficient. Therefore, attempts have been made to reduce the oxygen content in wafers, but such attempts have been unsuccessful in perfectly suppressing the formation of crystal defects.

Under such circumstances, epitaxial wafers having an epitaxial layer substantially free of crystal defects as formed therein have been developed and are now widely used in the manufacture of highly integrated devices. However, even epitaxial wafers high in crystallinity are used, the device characteristics are degraded due to contamination of the epitaxial layer with metal impurities in the subsequent device process steps.

The opportunity and influences of such contamination with impurity metal elements increase since the process becomes more complicated with the increase in integration density. The contamination may be eliminated basically by cleaning the process environment and materials used. However, it is difficult to render the device process completely free of contaminants, hence the gettering technology becomes necessary as a measure for solving that problem. This is a means for entrapping contaminant impurity elements in a region (sink) other than the device active region to thereby render the contaminants harmless.

The gettering technology includes intrinsic gettering (hereinafter referred to as "IG" for short) which comprises entrapping impurity elements by utilizing oxygen-caused oxide precipitates spontaneously induced during heat treatment in the device process steps. However, when a wafer is heat-treated at a temperature as high as 1050–1200° C. in the epitaxial step, oxide precipitate nuclei occurring within the wafer sliced from a silicon single crystal shrink and vanish, whereby it becomes difficult to sufficiently induce oxide precipitates to serve as gettering sources within the wafer in the subsequent device process steps. Thus, even if the gettering technology is applied, a problem arises that any satisfactory IG effect cannot be exerted on metal impurities throughout the whole process.

To overcome such a problem, methods of producing silicon single crystals have been proposed in the art which comprise doping the single crystals with nitrogen while they are grown by the CZ method, to thereby induce formation, within wafers, of oxide precipitate nuclei hardly vanishing even upon high temperature heat treatment in the epitaxial step (cf. e.g. Japanese Patent Application Laid-Open (Kokai) No. H11-189493 and Japanese Patent Application Laid-Open (Kokai) No. 2000-44389).

According to the methods proposed, a silicon single crystal having oxide precipitate nuclei which hardly shrink or vanish can be obtained by increasing the thermal stability of oxide precipitate nuclei in the crystal by doping it with nitrogen while growing it by the CZ method. It is alleged that oxide precipitate nuclei remaining in wafers sliced from such single crystal after the epitaxial step form oxide precipitates from the early stages of the device step and thus effectively serve as sinks for gettering, so that the effects of IG can be expected.

Later investigations, however, have revealed that thermally stable oxide precipitate nuclei which will not vanish even upon high temperature heat treatment can indeed be obtained by high concentration nitrogen doping of wafers but these oxide precipitate nuclei readily induce epitaxial layer defects. In other words, high concentration nitrogen doping results in the formation of stable oxide precipitate nuclei near the wafer surface but these nuclei induce stacking faults, dislocations and the like, namely epitaxial layer defects, in the epitaxial layer, which is the device active region. These defects cause an increase in the leakage current and degradation in the gate oxide integrity, among others.

SUMMARY OF THE INVENTION

In view of the epitaxial layer defect problem caused by conventional nitrogen doping, it is a primary object of the present invention to provide an epitaxial wafer scarcely showing epitaxial layer defect development as a result of suppressed growth of thermally stable oxide precipitate nuclei in spite of its being derived from a wafer sliced from a silicon single crystal pulled up in a nitrogen-doped form as well as a method of pulling up a silicon single crystal to serve as a raw material for such wafer.

To specify the temperature range in which thermally stable oxide precipitate nuclei are formed in nitrogen-doped single crystals, the present inventors made experiments in which a raw material silicon melt was doped with $1\times10^{14}$ atoms/cm$^3$ of nitrogen and the pulling rate was varied during the step of pulling up to give silicon single crystals A and B having a diameter of 6".

The concrete method of experimentation was as follows. A cylindrical portion was formed at an initial pulling rate of 0.7 mm/min and, at the time of arrival at a length of 500 mm, the pulling rate was reduced to 0.2 mm/min in the case of crystal A, or increased to 1.2 mm/min in the case of crystal B. Then, after growth to a cylindrical portion length of 550 mm, the pulling rate was again returned to 0.7 mm/min and the crystal was grown to 850 mm and then the pulling up is finished by tailing.

The thus-grown single crystal has a different thermal history depending on the change in pulling rate. For example, in the case of crystal A, the reduction in pulling rate results in slow cooling in the temperature range from the temperature at the start of rate reduction to a lower temperature side by about 100° C. while, in the case of crystal B, the increase in pulling rate results in rapid cooling in the temperature range from the temperature at the start of rate increase to a lower temperature side by about 100° C.

After pulling up in the above pulling rate changing experiments, samples were sliced from that portion of each single crystal which had been cooled within the temperature range of 1400° C. (nitrogen concentration of $2.3\times10^{14}$ atoms/cm$^3$) to 800° C. (nitrogen concentration of $1.6\times10^{14}$ atoms/cm$^3$) and measured for defect density. First, each sample was processed for lengthwise cleavage and the density of grown-in defects, namely void defects, which had been generated was determined. For void defect detection on that occasion, Bio-Rad's defect detector OPP (optical precipitate profiler) was used, and that density was evaluated. Then, the sample was treated at 1200° C. for 4 hours (as high temperature heat treatment) and subjected to selective etching (Wright etching) to 2 μm and measured for heat treatment-induced defect density (oxide precipitate density) under an optical microscope.

FIG. 2 is a graphic representation of the relationship between the OPP defect density (grown-in defect density) and the temperature at the start of pulling rate changing as found in the pulling rate changing experiments. The relationship shown in FIG. 2 indicates that the density of grown-in defects increased in the temperature range of 1150–1050° C. in crystal A while that density rather decreased in the same temperature range in crystal B.

The phenomenon seen in FIG. 2 teaches that the formation of grown-in defects occurs in the above temperature range. Thus, in crystal A, grown-in defects increase in size as a result of slow cooling and an increased number of defects were detected whereas, in crystal B, rapid cooling did not result in significant growth of grown-in defects and a low defect density was measured.

FIG. 3 is a graphic representation of the relationship between the etch pit density and the temperature at the start of pulling rate changing as found in the pulling rate changing experiments. As the results shown in FIG. 3 indicate, the etch pit density decreased in the temperature range of 1150–1050° C. and increased in the temperature range of 1050–950° C. in crystal A. In crystal B, on the contrary, the etch pit density increased in the temperature range of 1150–1050° C. and decreased in the temperature range of 1050–950° C.

As regards the phenomena in the two temperature ranges as shown in FIG. 3, firstly, the temperature range of 1150–1050° C. is the temperature range in which grown-in defects are formed, as mentioned hereinabove, and the relevant phenomenon in crystal A indicates that vacancies were sufficiently consumed in grown-in defects and the subsequent growth of oxide precipitate nuclei was suppressed. In crystal B, on the other hand, the relevant phenomenon shows that since it was rapidly cooled in the same temperature range of 1150–1050° C., grown-in defects were not formed to a sufficient extent but a large number of vacancies remained, so that the subsequent growth of oxide precipitate nuclei was promoted. Secondly, the temperature range of 1050–950° C. is the temperature range in which thermally stable oxide precipitate nuclei grow, and, in crystal A, oxide precipitate nuclei were sufficiently grown as a result of slow cooling while, in crystal B, rapid cooling resulted in failure in oxide precipitate nucleus formation.

As discussed above, when a silicon single crystal is doped with nitrogen, those thermally stable oxide precipitate nuclei which will not vanish even upon high temperature heat treatment in the epitaxial step serve as epitaxial layer defect-causing factors. On the other hand, from the results shown in FIGS. 2 and 3, it becomes apparent that the temperature range in which thermally stable oxide precipitate nuclei grow as a result of nitrogen doping is 1050–950° C. and that the cooling process in the temperature range of 1150–1050° C. in which grown-in defects are formed influences the growth of oxide precipitate nuclei.

In other words, by controlling the thermal history in those temperature ranges in the step of single crystal pulling up, it becomes possible to suppress the growth of thermally stable oxide precipitate nuclei otherwise formed in the single crystal and thereby decrease the number of epitaxial layer defects.

The present invention, which has been completed based on the findings derived by analyzing the results of the above pulling rate changing experiments by the CZ method, consists of the following single crystal pulling up methods specified under (1) to (3) and the epitaxial wafer manufacturing method specified below under (4).

(1) A method of pulling up a single crystal from a silicon material melt doped with nitrogen while allowing the single crystal to grow, which method is characterized in that the period over which the single crystal passes through or remain in the temperature range of 1150–1050° C. in the step of single crystal pulling up is not less than 50 minutes.

(2) A method of pulling up a single crystal from a silicon material melt doped with nitrogen while allowing the single crystal to grow, which method is characterized in that the period over which the single crystal passes through or remain in the temperature range of 1050–950° C. in the step of single crystal pulling up is not more than 40 minutes.

(3) A method of pulling up a single crystal from a silicon material melt doped with nitrogen while allowing the single crystal to grow, which method is characterized in that the period over which the single crystal passes through or remain in the temperature range of 1150–1050° C. in the step of single crystal pulling up is not less than 50 minutes and that the period over which the single crystal then passes through or remain in the temperature range of 1050–950° C. is not more than 40 minutes.

(4) A method of manufacturing epitaxial wafers which comprises growing an epitaxial layer on the surface of a silicon wafer sliced from a single crystal pulled up by one of the methods mentioned above under (1) to (3).

BRIEF DESCRIPTION OF THE DRAWINGS

FIGS. 7A and 7B is a comparative representation, in longitudinal cross section, of a conventional apparatus (left half) and a producing apparatus optimized with respect to the hot zone thereof (right half).

DESCRIPTION OF PREFERRED EMBODIMENTS

It is thermally stable, grown oxide precipitate nuclei that induce epitaxial layer defects in nitrogen-doped crystals. Further, it is possible to control the growth of thermally stable oxide precipitate nuclei in a single crystal by controlling the cooling process in the temperature range of 1050–950° C., which is the oxide precipitate range, and in the temperature range of 1150–1050° C., which is the grown-in defect formation range. Thus, by controlling the thermal history in the above two temperature regions in the step of single crystal pulling up, it is possible to prevent thermally stable oxide precipitate nuclei from growing and thus reduce the occurrence of epitaxial layer defects.

Thus, the method of single crystal pulling up of the present invention is characterized in that slow cooling is performed in the temperature range of 1150–1050° C. and/or rapid cooling is performed in the temperature range of 1050–950° C. It is of course possible to combine slow cooling in the temperature range of 1150–1050° C. and rapid cooling in the temperature region of 1050–950° C. to thereby suppress the growth of thermally stable oxide precipitate nuclei in the single crystal with certainty.

Figure 5:
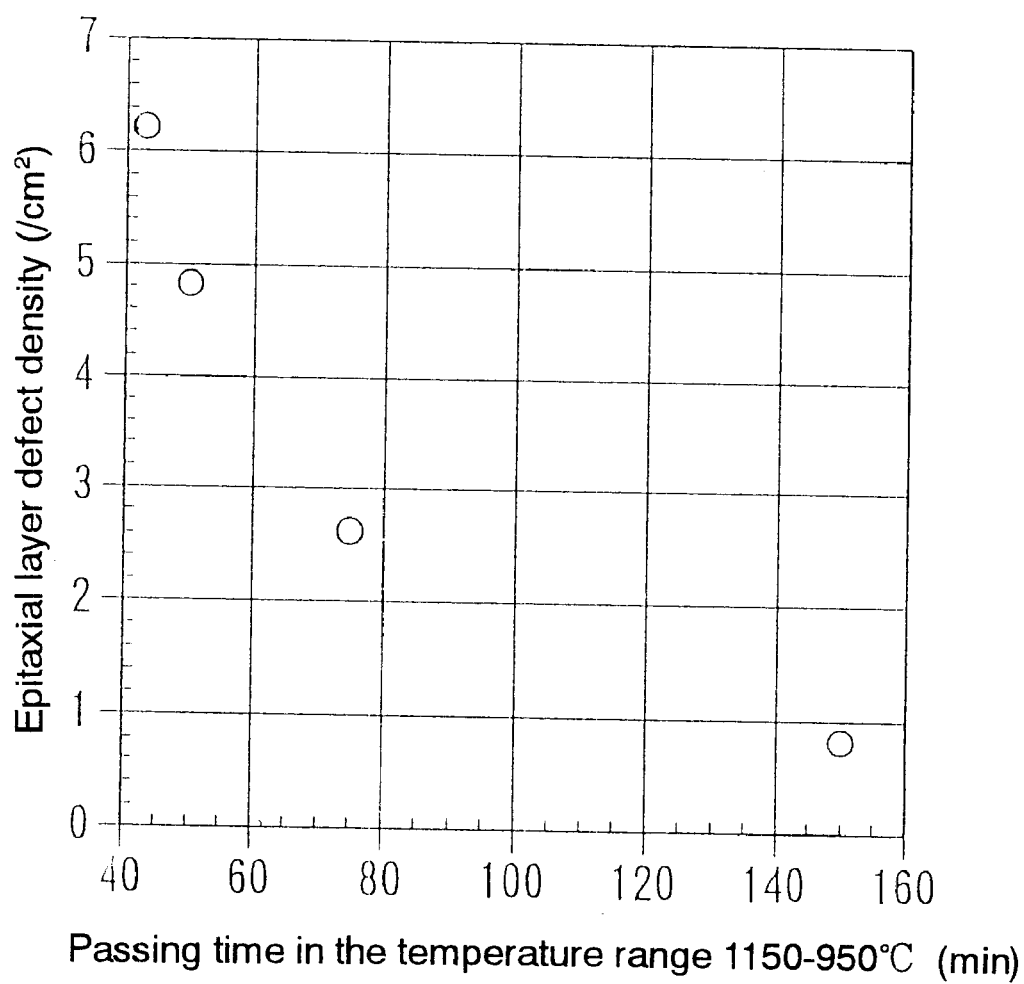
FIG. 5 is a graphic representation of the relationship between the period of passage through the temperature range of 1150–1050° C. as found in Example 2.

First, the slow cooling conditions in the temperature range of 1150–1050° C., which is the grown-in defect formation range, are selected so that the period of passage through this temperature range amounts to not less than 50 minutes. By this, it is possible to secure such slow cooling conditions as to correspond to a cooling rate of not more than 2.0° C./min. The requirement that the passing or residence time in that temperature range should be not less than 50 minutes is based on the effects of slow cooling as confirmed by the pulling rate changing experiments, as shown in FIG. 5 which is mentioned later in the Examples section.

It is to be repeated that it is possible, by performing slow cooling over a passing time of not less than 50 minutes in the temperature range of 1150–1050° C., to promote the formation of grown-in defects and allow vacancies to be consumed to a sufficient extent, with the result that the subsequent growth of thermally stable oxide precipitate nuclei can be prevented, hence the generation of epitaxial layer defects can be reduced.

Figure 1:
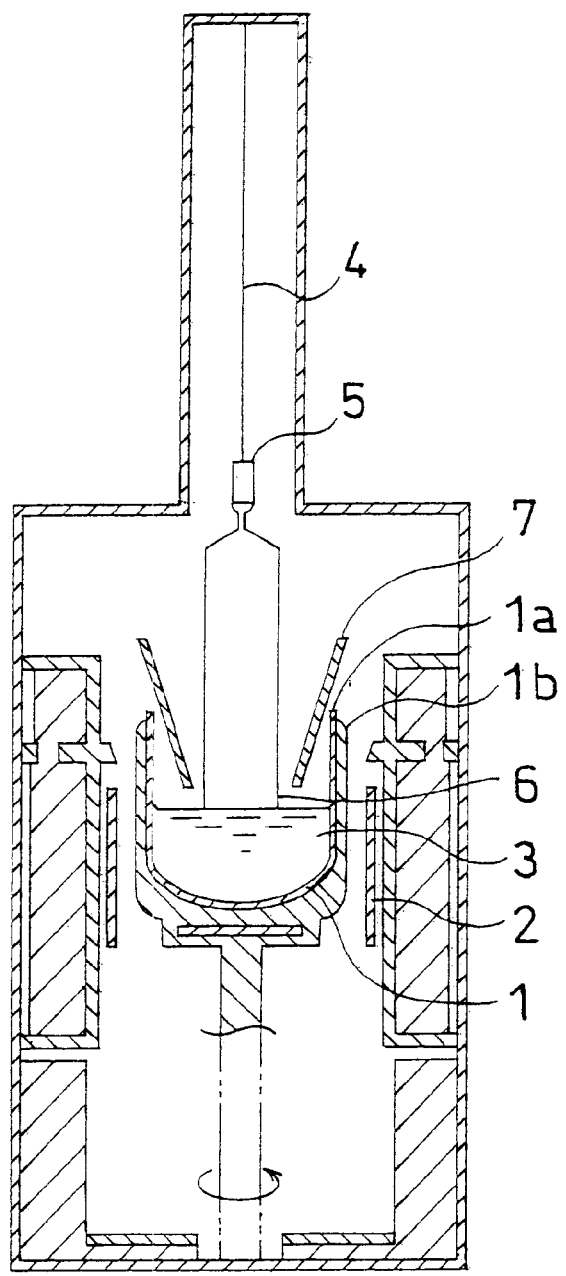
FIG. 1 is a longitudinal sectional view schematically illustrating the constitution of a producing apparatus is which the CZ method is carried out.
Figure 2:
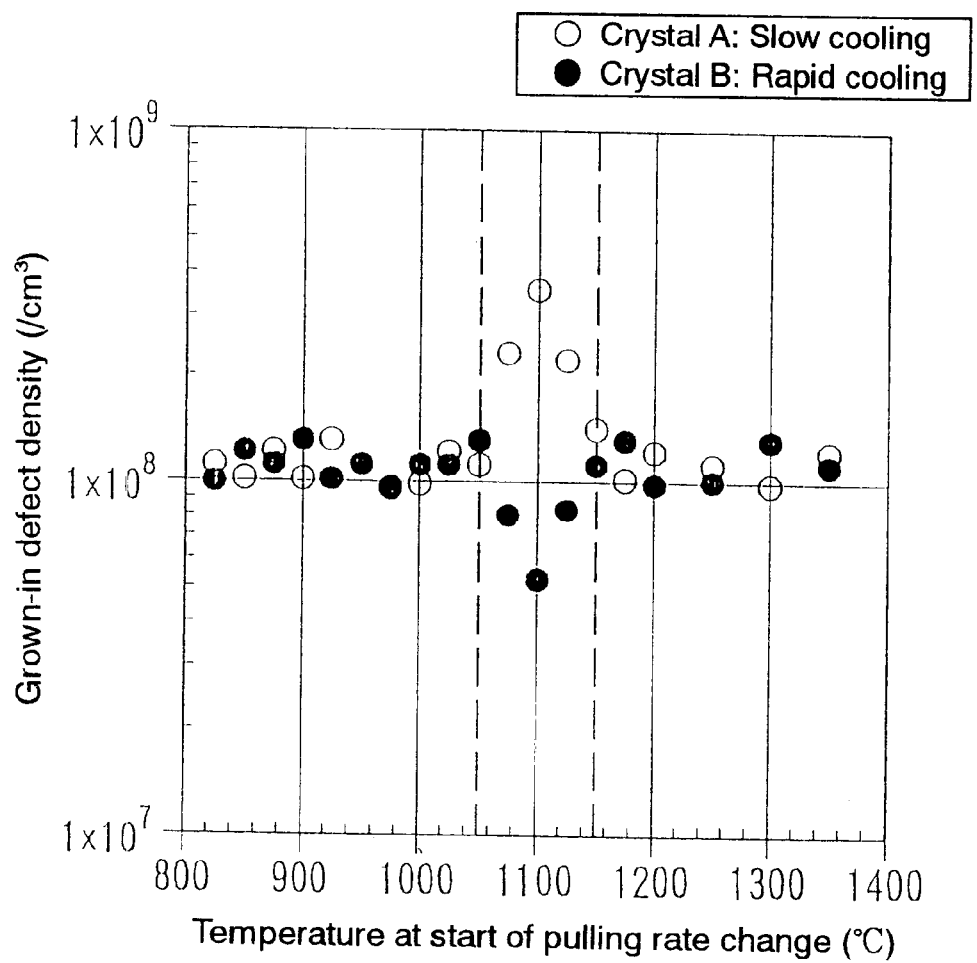
FIG. 2 is a graphic representation of the relationship between the density of OPP defects (grown-in defects) and the temperature at the start of changing pulling rate as found by the pulling rate changing experiments.
Figure 3:
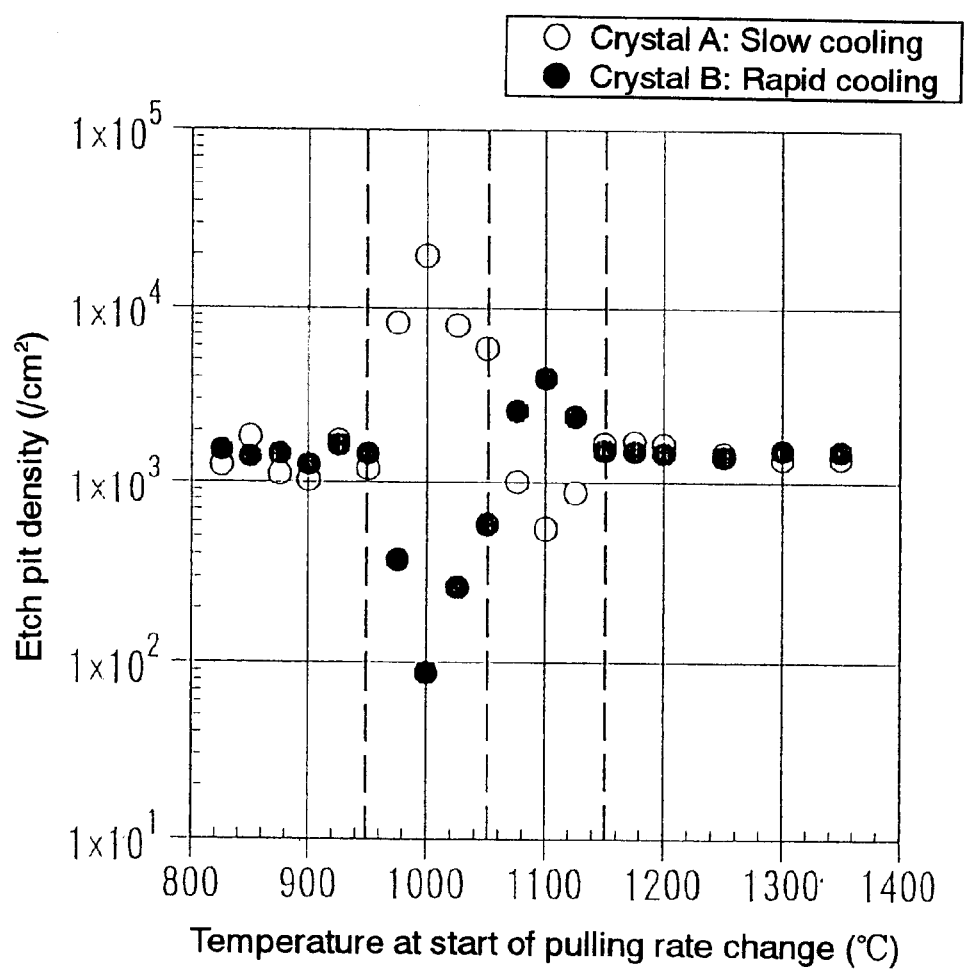
FIG. 3 is a graphic representation of the relationship between the etch pit density and the temperature at the start of pulling rate changing as found by the pulling rate changing experiments.
Figure 4:
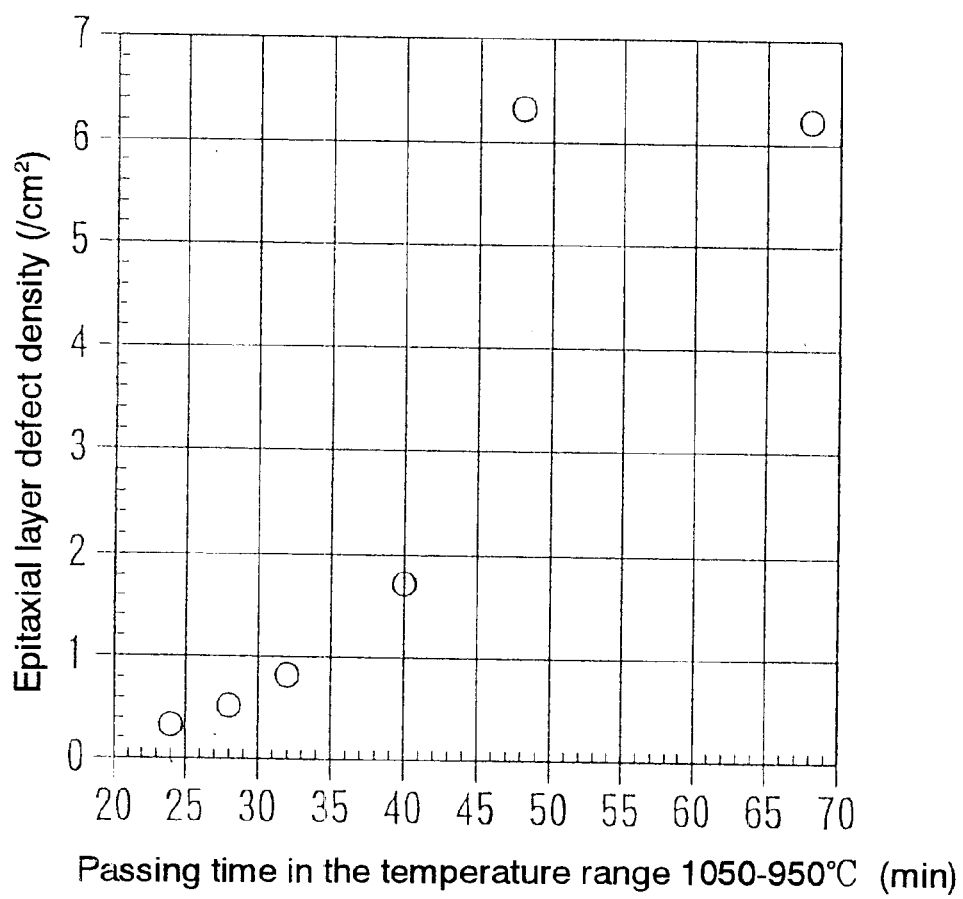
FIG. 4 is a graphic representation of the relationship between the period of passage through the temperature range of 1050–950° C. and the density of epitaxial layer defects as found in Example 1.

In the next stage, the rapid cooling conditions in the temperature range of 1050–950° C., in which the growth of oxide precipitate nuclei is promoted, are such that the passing time in this temperature range should be not more than 40 minutes. By this, it is possible to secure cooling conditions corresponding to a cooling rate of not less than 2.5° C./min. The requirement that the passing or residence time in that temperature range should be not more than 40 minutes is based on the effects of rapid cooling as confirmed by the pulling rate changing experiments as shown in FIG. 4 which is mentioned later in the Examples section.

According to the present invention, the growth of oxide precipitate nuclei is suppressed and the occurrence of epitaxial layer defects is prevented by rapid cooling such that the passing time in the temperature range, in which thermally stable oxide precipitate nuclei are formed, amounts to not more than 40 minutes.

The growth of oxide precipitate nuclei in the single crystal is influenced by the concentrations of nitrogen and oxygen contained therein. According to the results of investigations made by the present inventors, the occurrence of epitaxial layer defects cannot be prevented when the nitrogen concentration in the single crystal is excessively high and, when, conversely, the nitrogen concentration is too low, no satisfactory IG effects can be obtained. Thus, the nitrogen concentration in the single crystal is desirably in the range of $1.0 \times 10^{12}$ to $1.0 \times 10^{15}$ atoms/cm$^3$.

As mentioned hereinabove, the single crystal pulled up by the CZ method contains supersaturation oxygen. When the oxygen concentration in the single crystal is excessively high, it becomes difficult to suppress epitaxial layer defects. Accordingly, the oxygen concentration is desirably not more than $12 \times 10^{17}$ atoms/cm$^3$ (ASTM '79).

The epitaxial wafer according to the present invention is manufactured by slicing a wafer from a silicon single crystal doped with nitrogen in step of pulling up in the CZ method and controlled in thermal history and, after surface polishing and washing, causing an epitaxial layer to be formed thereon. In growing the epitaxial layer, any of the techniques of forming crystal defect-free epitaxial layers, for example the thermal decomposition method such as the vapor phase growth method, may be applied to the surface of the wafer sliced from the above-mentioned single crystal.

EXAMPLES

The following typical examples, Example 1 to 3, illustrate the effects of the present invention.

Example 1

Experiments were carried out in which the pulling rate was varied in the process of pulling up six silicon single crystals with a diameter of 6" while doping a silicon material melt with $1 \times 10^{14}$ atoms/cm$^3$ of nitrogen. The particular conditions were as follows. A cylindrical portion was allowed to grow at an initial pulling rate of 0.7 mm/min and, after attainment of a cylindrical portion length of 500 mm, the pulling rate was changed to 0.7 mm/min (not change), 1.0 mm/min, 1.2 mm/min, 1.5 mm/min. 1.7 mm/min, or 2.0 mm/min for the respective single crystals. Then, after arrival of the cylindrical portion length at 550 mm, the pulling rate was returned to 0.7 mm/min again and, after growing to a length of 850 mm, the single crystal pulling up was finished by tailing.

That portion (nitrogen concentration of $1.8 \times 10^{14}$ atoms/cm$^3$) of each single crystal obtained in the above manner which had been rapidly cooled in the temperature range of 1050–950° C. was taken, an epitaxial layer was formed on a silicon wafer sliced from that portion to a thickness of 4 μm and the layer was examined for epitaxial layer defects using a Surfscan surface defect detector.

FIG. 4 is a graphic representation of the relationship between the passing time in the temperature range of 1050–950° C. and the epitaxial layer defect density as found in Example 1. It is seen that when the passing time in the temperature range of 1050–950° C. was not more than 40 minutes (corresponding to a pulling rate of 1.2 mm/min after changing) to be rapid cooling, the growth of oxide precipitate nuclei was inhibited and the epitaxial layer defect density decreased to not more than 2 defects/cm$^2$.

Example 2

Experiments were carried out in which the pulling rate was varied in the process of pulling up four silicon single crystals with a diameter of 6" while doping a silicon material melt with $1 \times 10^{14}$ atoms/cm$^3$ of nitrogen. The experimental conditions were as follows. A cylindrical portion was allowed to grow at an initial pulling rate of 0.7 mm/min and, after attainment of a cylindrical portion length of 500 mm, the pulling rate was changed to 0.7 mm/min (not change), 0.6 mm/min, 0.4 mm/min or 0.2 mm/min for the respective single crystals. Then, after arrival of the cylindrical portion length at 550 mm, the pulling rate was returned to 0.7 mm/min again and, after growing to a length of 850 mm, the single crystal pulling up was finished by tailing.

That portion (nitrogen concentration of $1.9 \times 10^{14}$ atoms/cm$^3$) of each single crystal obtained in the above manner which had been slowly cooled in the temperature range of 1150–1050° C. was taken, an epitaxial layer was formed on a silicon wafer sliced from that portion to a thickness of 4 μm and the layer was examined for epitaxial layer defects using a Surfscan surface defect detector.

FIG. 5 is a graphic representation of the relationship between the passing time in the temperature range of 1150–1050° C. and the epitaxial layer defect density as found in Example 2. It is seen that when the passing time in the temperature range of 1150–1050° C. was not less than 50 minutes (corresponding to a pulling rate of 0.6 mm/min after changing) to be slow cooling, the epitaxial layer defect density decreased to not more than 5 defects/cm$^2$.

Example 3

In Example 3, experiments were carried out using a single crystal producing apparatus with the hot zone thereof optimized so that the cooling conditions in the grown-in defect formation temperature range and in the oxide precipitate nuclei growing temperature range might be satisfied.

FIG. 7 is a longitudinal sectional view for producing apparatus constitution comparison. FIG. 7A shows the sectional view of a conventional apparatus (left half thereof) and the thermal history of a single crystal pulled up therein and FIG. 7B shows the sectional view of a producing apparatus (right half thereof) with the hot zone thereof optimized and the thermal history of a single crystal pulled up therein.

In this example, as shown in FIG. 7B, a portion of the heat shield was cut off for optimizing the hot zone and the residence time in the temperature range of 1150–1050° C. was prolonged by applying radiant heat from the heater side to the single crystal and, further, by providing an insulator 7a on the heat shield, the radiant heat from the heater was reduced so that the residence time in the temperature range of 1050–950° C. might be shortened.

Using the producing apparatus shown in FIG. 7B, the melt of a silicon material was doped with $1 \times 10^{14}$ atoms/cm$^3$ of nitrogen, a silicon single crystal, 6" in diameter, was grown to a cylindrical portion length of 850 mm at a pulling rate of 1.0 mm/min and the pulling up was then finished.

That portion of each single crystal pulled up which corresponded to the portion of 200 mm (nitrogen concentration of $1.5 \times 10^{14}$ atoms/cm$^3$) to 600 mm (nitrogen concentration of $2.8 \times 10^{14}$ atoms/cm$^3$) of the cylindrical portion was taken, an epitaxial layer was formed to a thickness of 4 μm on the surface of a silicon wafer sliced from that portion, and the layer was tested for epitaxial layer defects using a Surfscan surface defect detector.

Figure 6:
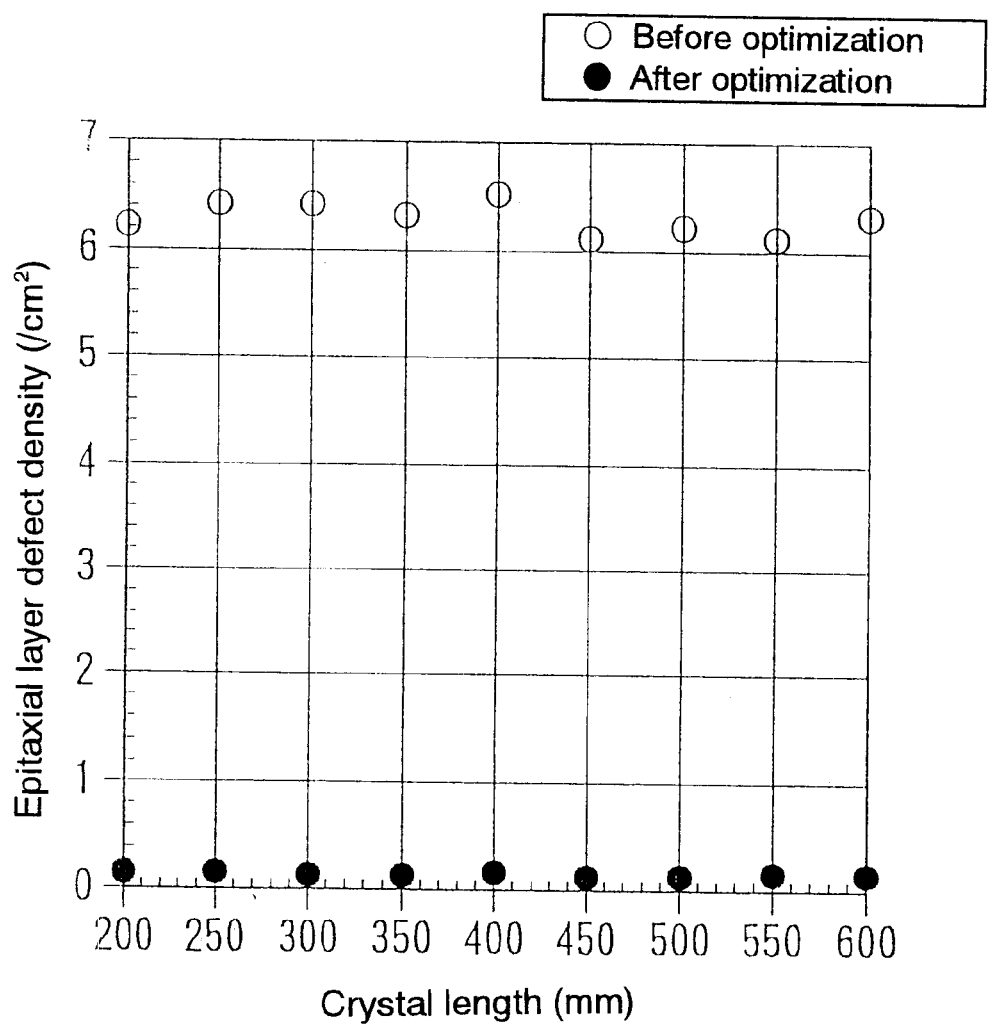
FIG. 6 is a graphic representation of a comparison in epitaxial layer defect density between single crystals grown in a producing apparatus prior to optimization of the hot zone thereof and single crystals grown in the same producing apparatus after optimization of the hot zone.

FIG. 6 is a graphic representation of the results of comparison in epitaxial layer defect density between single crystals grown in the producing apparatus before hot zone optimization (FIG. 7A) and single crystals grown in the producing apparatus after hot zone optimization (FIG. 7B). It is seen that all the single crystals pulled up in the producing apparatus prior to hot zone optimization showed a high epitaxial layer defect density of not less than 6 defects/cm$^2$ in the crystal length range of 200 mm to 600 mm, whereas the epitaxial layer defect density was reduced to an almost non-detection level by crystal pulling up in the producing apparatus after hot zone optimization.

As explained hereinabove, the method of single crystal pulling up according to the present invention, it is possible, even in the case of wafers prepared from silicon single crystals produced while doping with nitrogen, to prevent the growth of thermally stable oxide precipitate nuclei, which are causative of epitaxial layer defects. Accordingly, it is possible to produce high-quality epitaxial wafers less in epitaxial layer defect density by using wafers sliced from the silicon single crystals thus produced.

What is claimed is:

1. A method of pulling up a single crystal from a nitrogen-doped silicon material melt while allowing the single crystal to grow which comprises employing a passing or residence time in the temperature range of 1150–1050° C. of not less than 50 minutes in the step of pulling up of said single crystal, wherein the single crystal has a nitrogen concentration of $1.0\times10^{12}$ to $1.0\times10^{15}$ atoms/cm$^3$.

2. A method of pulling up a single crystal as claimed in claim 1, wherein the single crystal further has an oxygen concentration of not more than $12\times10^{17}$ atoms/cm$^3$ (ASTM '79).

3. A method of pulling up a single crystal from a nitrogen-doped silicon material melt while allowing the single crystal to grow which comprises employing a passing or residence time in the temperature range of 1050–950° C. of not more than 40 minutes in the step of pulling up of said single crystal, wherein the single crystal has a nitrogen concentration of $1.0\times10^{12}$ to $1.0\times10^{15}$ atoms/cm$^3$.

4. A method of pulling up a single crystal as claimed in claim 3, wherein the single crystal further has an oxygen concentration of not more than $12\times10^{17}$ atoms/cm$^3$ (ASTM '79).

5. A method of pulling up a single crystal from a nitrogen-doped silicon material melt while allowing the single crystal to grow which comprises employing a passing or residence time in the temperature range of 1150–1050° C. of not less than 50 minutes and then a passing or residence time in the temperature range of 1050–950° C. of not more than 40 minutes in the step of pulling up of said single crystal, wherein the single crystal has a nitrogen concentration of $1.0\times10^{12}$ to $1.0\times10^{15}$ atoms/cm$^3$.

6. A method of pulling up a single crystal as claimed in claim 5, wherein the single crystal further has an oxygen concentration of not more than $12\times10^{17}$ atoms/cm$^3$ (ASTM '79).

7. A method of manufacturing epitaxial wafers which comprises allowing an epitaxial layer to grow on the surface of a silicon wafer sliced from a single crystal pulled up from a nitrogen-doped silicon material melt while allowing the same to grow by employing a passing or residence time in the temperature range of 1150–1050° C. of not less than 50 minutes in the step of pulling up of said single crystal, wherein the silicon wafer has a nitrogen concentration of $1.0\times10^{12}$ to $1.0\times10^{15}$ atoms/cm$^3$.

8. A method of manufacturing epitaxial wafers as claimed in claim 7, wherein the silicon wafer further has an oxygen concentration of not more than $12\times10^{17}$ atoms/cm$^3$ (ASTM '79).

9. A method of manufacturing epitaxial wafers which comprises allowing an epitaxial layer to grow on the surface of a silicon wafer sliced from a single crystal pulled up from a nitrogen-doped silicon material melt while allowing the single crystal to grow by employing a passing or residence time in the temperature range of 1050–950° C. of not more than 40 minutes in the step of pulling up of said single crystal, wherein the silicon wafer has a nitrogen concentration of $1.0\times10^{12}$ to $1.0\times10^{15}$ atoms/cm$^3$.

10. A method of manufacturing epitaxial wafers as claimed in claim 9, wherein the silicon wafer further has an oxygen concentration of not more than $12\times10^{17}$ atoms/cm$^3$ (ASTM '79).

11. A method of manufacturing epitaxial wafers which comprises allowing an epitaxial layer to grow on the surface of a silicon wafer sliced from a single crystal pulled up from a nitrogen-doped silicon material melt while allowing the single crystal to grow by employing a passing or residence time in the temperature range of 1150–1050° C. of not less than 50 minutes and then a passing or residence time in the temperature range of 1050–950° C. of not more than 40 minutes in the step of pulling up of said single crystal, wherein the silicon wafer has a nitrogen concentration of $1.0\times10^{12}$ to $1.0\times10^{15}$ atoms/cm$^3$.

12. A method of manufacturing epitaxial wafers as claimed in claim 11, wherein the silicon wafer further has an oxygen concentration of not more than $12\times10^{17}$ atoms/cm$^3$.

* * * * *

UNITED STATES PATENT AND TRADEMARK OFFICE
CERTIFICATE OF CORRECTION

PATENT NO. : 6,569,237 B2
DATED : May 27, 2003
INVENTOR(S) : Tanaka et al.

It is certified that error appears in the above-identified patent and that said Letters Patent is hereby corrected as shown below:

Title page,
Item [73], Assignee, change "Sumitomo Metal Industries, Ltd., Osaka (JP)" to
-- Sumitomo Mitsubishi Silicon Corporation, Tokyo (JP) --

Signed and Sealed this

Twenty-eighth Day of October, 2003

JAMES E. ROGAN
*Director of the United States Patent and Trademark Office*